US005581143A

United States Patent [19]

Miura et al.

[11] Patent Number: 5,581,143

[45] Date of Patent: Dec. 3, 1996

[54] TWIST VIBRATOR

[75] Inventors: Shinsuke Miura, Tokyo; Tsutomu Odagiri, Chiba-ken, both of Japan

[73] Assignee: Yamaichi Electronics Co., Ltd., Tokyo, Japan

[21] Appl. No.: 559,719

[22] Filed: Nov. 15, 1995

Related U.S. Application Data

[63] Continuation of Ser. No. 305,719, Sep. 14, 1994, abandoned.

[30] Foreign Application Priority Data

Sep. 21, 1993 [JP] Japan .................................... 5-257744

[51] Int. Cl.$^{6}$ .................................................... H01L 41/08

[52] U.S. Cl. ............................................ 310/333; 310/332

[58] Field of Search .................................... 310/330, 332, 310/333

[56] References Cited

U.S. PATENT DOCUMENTS

| | | | |
|---|---|---|---|
| 3,219,850 | 11/1965 | Langevin | 310/333 |
| 4,339,682 | 7/1982 | Toda et al. | 310/332 |
| 4,399,385 | 8/1983 | Osaka et al. | 310/330 |
| 4,708,600 | 11/1987 | AbuJudom et al. | 310/330 |
| 4,811,593 | 3/1989 | Miura et al. | 73/54 |

FOREIGN PATENT DOCUMENTS

| | | | |
|---|---|---|---|
| 2852795 | 6/1979 | Germany | 310/332 |
| 0208433 | 5/1984 | Germany | 310/332 |
| 0464111 | 2/1971 | Japan | 310/332 |
| 0079270 | 4/1986 | Japan | 310/332 |
| 0054983 | 3/1987 | Japan | 310/332 |
| 5-13401 | 2/1993 | Japan | H03H 9/24 |
| 0087557 | 2/1958 | Netherlands | 310/330 |
| 0686155 | 9/1979 | U.S.S.R. | 310/333 |

*Primary Examiner*—Thomas M. Dougherty
*Attorney, Agent, or Firm*—Wenderoth, Lind & Ponack

[57] ABSTRACT

A twist vibrator includes a piezoelectric bimorph which vibrates at a fist end thereof in a twisting direction, and a rigid block connected to a second end of the bimorph. The rigid block restrains the second end from being deformed.

8 Claims, 3 Drawing Sheets

TWIST VIBRATOR

This application is a continuation of now abandoned application, Ser. No. 08/305,719, filed Sep. 14, 1994.

BACKGROUND OF THE INVENTION

1. Field of the Invention

The present invention relates to a twist vibrator utilizing a piezoelectric bimorph.

2. Brief Description of the Prior Art

Japanese Patent Publication No. Hei 5-13401 provides a piezoelectric bimorph, i.e. a twist vibrator, having twisted opposite ends, which comprises a pair of piezoelectric ceramic members having a rectangular shape and cemented to each other, each of the piezoelectric ceramic members being divided into four quadrants, whereby the piezoelectric ceramic members are bent in one direction of thickness at one diagonal corner thereof and in the other direction of thickness at the other diagonal corner thereof, thus permitting the pair of piezoelectric ceramic members, or piezoelectric bimorph as a whole, to perform twist vibratory motion.

However, the above conventional device has the following shortcomings and/or inconveniences.

That is, with such twist vibrator, although only one end is used as an output end for performing twist vibratory motion, the other end is also wastefully designed to perform twist vibratory motion. Since the twist vibrator is of a construction vibrating at opposite ends thereof, excessive ceramic material is used and therefore economic efficiency is inferior. Furthermore, the piezoelectric bimorph becomes large in size.

Also, since the twist vibrator performs twist vibratory motion at opposite ends thereof, its fixing area with respect to a support member is limited. For example, if its opposite end with respect to the output end is fixed, since the twist vibratory motion, which would otherwise be performed as initially intended, of such opposite end is restrained or stopped due to fixing thereof, the reaction causes the amount of twist vibratory motion of the output end to be reduced.

Although the center (node of vibration) of twist vibration of the piezoelectric bimorph can be used as a fixing area, the position of such node is very difficult to specify. In addition, since an area required for fixture is difficult to obtain, firm fixing to a support member is also very difficult.

SUMMARY OF THE INVENTION

It is, therefore, an object of the present invention to provide a twist vibrator in which active twist vibration is produced from only one end thereof.

Another object of the present invention is to provide a twist vibrator which can be firmly fixed to a support member.

To achieve the above objects, there is essentially provided a twist vibrator comprising a piezoelectric bimorph which vibrates in a twisting direction at a first end thereof, and a rigid block connected to a second end of the piezoelectric bimorph and adapted to restrain the second end from being deformed.

Preferably, the piezoelectric bimorph is formed of a cemented member of a vibrating plate and a piezoelectric plate, the rigid block being connected to one end of the vibrating plate but not connected directly to an adjacent end portion of the piezoelectric plate.

The piezoelectric bimorph may be of a square configuration, and the rigid block is connected to the square-shaped piezoelectric bimorph over the entire length of one end thereof.

Also, the piezoelectric bimorph may be radially arranged relative to a center thereof that is integral with the rigid block.

Since the twist vibrator according to the present invention is of the construction in which a piezoelectric bimorph, which is vibrated in a twisting direction at one end (first end) thereof, is connected at the other end (second end) to a rigid block adapted to restrain the second end from being deformed, active twist vibration is induced from only the first end of the vibrator. As a result, such first end can be effectively used as a vibration source for outputting vibration from an output end of the vibrator.

Furthermore, since the rigid block is not twisted, it can be used, either directly or indirectly, as a fixing means with respect to a support member. Thus, the problem of adverse effects to the twist vibration of the output end of the vibrator due to fixture thereof be avoided. In addition, a sufficient fixing area can be obtained for ensuring firm fixation.

Moreover, while assuredly maintaining the same amount of twisting vibration as that of the conventional twist vibrator on the output end side, the amount of material of the piezoelectric element such as ceramic material can be reduced by half, the cost can be lowered, the size can be reduced, and manufacture can be simplified.

The novel features which are considered characteristic of this invention are set out in the appended claims. The invention itself, however, together with additional objects and advantages thereof will be best understood from the following detailed description taken in conjunction with the accompanying drawings which illustrate, by way of example only, some preferred embodiments of this invention.

DETAILED DESCRIPTION OF THE EMBODIMENT

Figure 1:
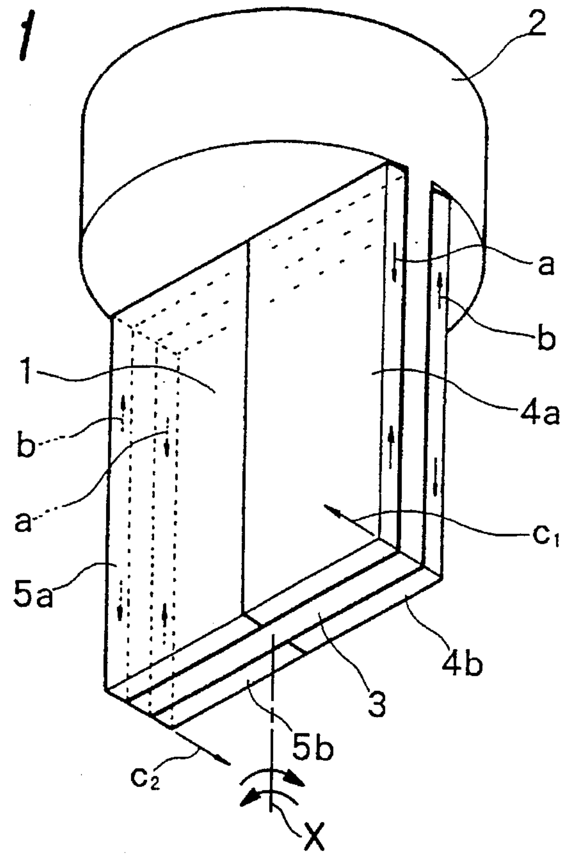
FIG. 1 is a perspective view of a twist vibrator according to one embodiment of the present invention.

Some preferred embodiments of the present invention will now be described in detail with reference to FIGS. 1 to 6 of the accompanying drawings.

A twist vibrator of the invention includes a piezoelectric bimorph 1 and a rigid block 2, and in which vibration is induced at only one end thereof. The piezoelectric bimorph 1 comprises a vibrating plate 3 formed of a metal plate or the like, a pair of piezoelectric plates 4*a* and 5*a*, which are made of ceramic material or the like, attached, side by side, to one planar surface of opposite planar surfaces of the vibrating plate 3, and another pair of piezoelectric plates 4*b* and 5*b* attached, side by side, to the planar surface, such that the piezoelectric plates 4*a* and 4*b* are arranged in opposite relation to each other and the piezoelectric plates 5*a* and 5*b* are likewise arranged in opposite relation to each other.

With respect to the piezoelectric plates 4*a* and 4*b*, when one of the piezoelectric plates, i.e. the plate 4*a*, contracts a in its lengthwise direction due to supply of voltage, the other piezoelectric plate 4*b* elongates b in the lengthwise direction. The contraction a and elongation b are performed in turn. As a result, the piezoelectric bimorph 1 is bent $c_1$ to one side thereof with respect to the direction of thickness, at the area where the piezoelectric plates 4*a* and 4*b* are attached to each other.

At the same time, with respect to the piezoelectric plates 5*a* and 5*b*, when one of the piezoelectric plates, i.e., the plate 5*a*, elongates b in the lengthwise direction, the other piezoelectric plate 5*a* contracts a in the lengthwise direction. The elongation b and contraction a are performed in turn. As a result, the piezoelectric bimorph 1 is bent $c_2$ to the other side thereof with respect to the direction of thickness, at the area where the piezoelectric plates 5*b* and 5*a* are attached to each other. The directions of the bending $c_1$ and $c_2$ are reverse to each other.

This is, plate 4*a* is operated (i.e., contracted and elongated) in directions opposite from directions of operations of plate 4*b*, and plate 5*a* is operated indirections opposite from directions of operation of plate 5*b*. Also, the directions of operation of plate 4*a* are opposite those of plate 5*a*, while directions of operation of plate 4*a* are opposite those of plate 5*b*.

Since the piezoelectric plates 4*a*, 4*b*, 5*a*, and 5*b* commonly have the vibrating plate 3 which produces the bending $c_1$ and $c_2$, when the piezoelectric bimorph 1 is seen as a whole, the bendings $c_1$ and $c_2$ are produced in turn at left corner portions and right corner portions of one ends thereof (as viewed in the drawings). That is to say, the piezoelectric bimorph 1 is twist vibrated at one end thereof in opposite directions about a longitudinal axis X of the bimorph and the twist vibrator.

Figure 2:
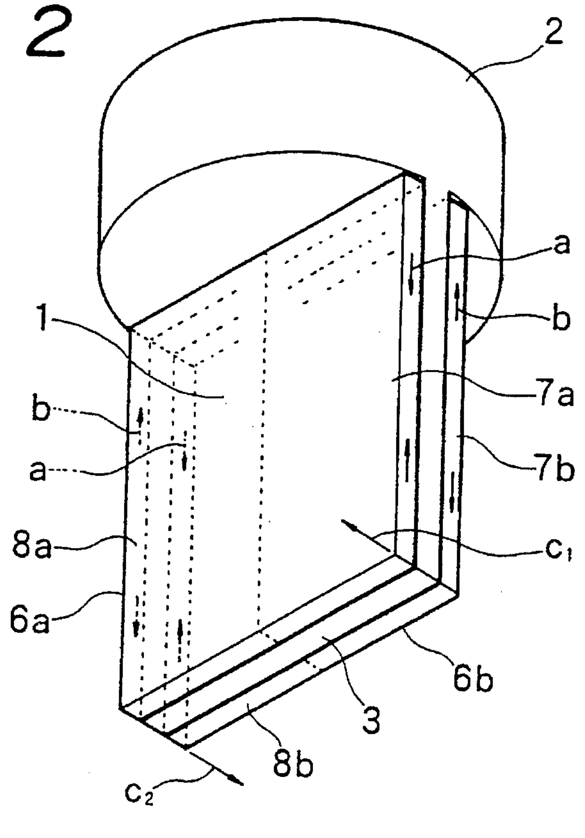
FIG. 2 is a perspective view of a twist vibrator according to another embodiment of the present invention.

In the embodiment shown in FIG. 1, the bending $c_1$ and $c_2$, i.e., twist vibration, is formed of the piezoelectric bimorph 1 which comprises vibrating plate 3 and four piezoelectric plates 4*a*, 4*b*, 4*c* and 4*d*, whereas in another embodiment shown in FIG. 2, piezoelectric plates 6*a* and 6*b* are each attached to each of the opposite surfaces of the vibrating plate 3, and the piezoelectric plates 6*a* and 6*b* are each divided into two areas (boring areas) 7*a*, 7*b*, and 8*a*, 8*b*, respectively, by an imaginary line. In the embodiment of FIG. 2, a twist vibration as that of FIG. 1 is produced.

That is, in the pair of opposite divided areas (7*a* and 7*b* corresponding to 4*a*, 4*b* of FIG. 1), the contraction a of one area 7*a* and the elongation b of the other area 8*b* occur in turn, whereas in the remaining pair of opposite divided areas (8*a* and 8*b* corresponding to 5*a* and 5*b* of FIG. 1), the elongation b of one area and the contraction a of the other area occur in turn.

The vibrating plate 3 and the piezoelectric plates 4*a*, 4*b*, 5*a*, 5*b*, 6*a* and 6*b* are of square shape, and the piezoelectric bimorph 1 is also of square shape. Otherwise, the vibrating plate 3 is of square shape and the piezoelectric plates are of desired shape.

Also, in the present invention, the vibrating plate 3, i.e., piezoelectric bimorph 1, can have such a deformed outer shape as a half-circle.

Either one or both of the pair of opposite piezoelectric plates 4*a* and 4*b*, or either one or both of the pair of opposite piezoelectric plates 5*a* and 5*b* may comprise a plurality of piezoelectric plates.

The bimorph 1 may be comprised by attaching the piezoelectric plates 6*a* and 6*b* directly to each other without interposing the vibrating plate 3 of FIG. 2 therebetween.

The rigid block 2 is connected integrally to the other end or second end (that end opposite to the end (first end) where the bendings $c_1$ and $c_2$ occur in the mutually reverse directions) of the piezoelectric bimorph 1 thus constructed and is adapted to restrain the second end from deforming.

Due to the integral connection of the rigid block 2, the second end of the piezoelectric bimorph 1 is not deformed in spite of the twisting-direction vibration (bending $c_1$ and $c_2$) produced at the first end, and the active twist vibration is effectively induced only at the first end.

As one example of connection of the rigid block 2 to the piezoelectric bimorph 1, as mentioned above, the piezoelectric bimorph 1 is formed of a cemented-member which comprises the vibrating plate 3 and the piezoelectric plates 4*a* to 6*b* cemented or attached to the vibrating plate 3, the rigid block 2 being connected to the end of the vibrating plate 3, the ends of the piezoelectric plates being not connected directly with respect to the rigid block.

Preferably, the piezoelectric bimorph 1 is formed in a square shape, and the rigid block 2 is connected to the square piezoelectric bimorph 1 generally over the entire length of the end thereof, so that the effect for restraining deformation may be enhanced.

Figure 3:
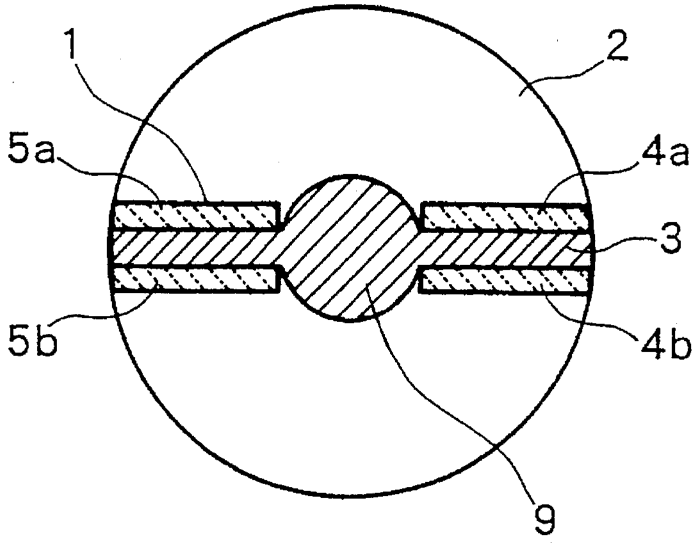
FIG. 3 is a sectional view of a twist vibrator according to still another embodiment of the present invention.
Figure 5:
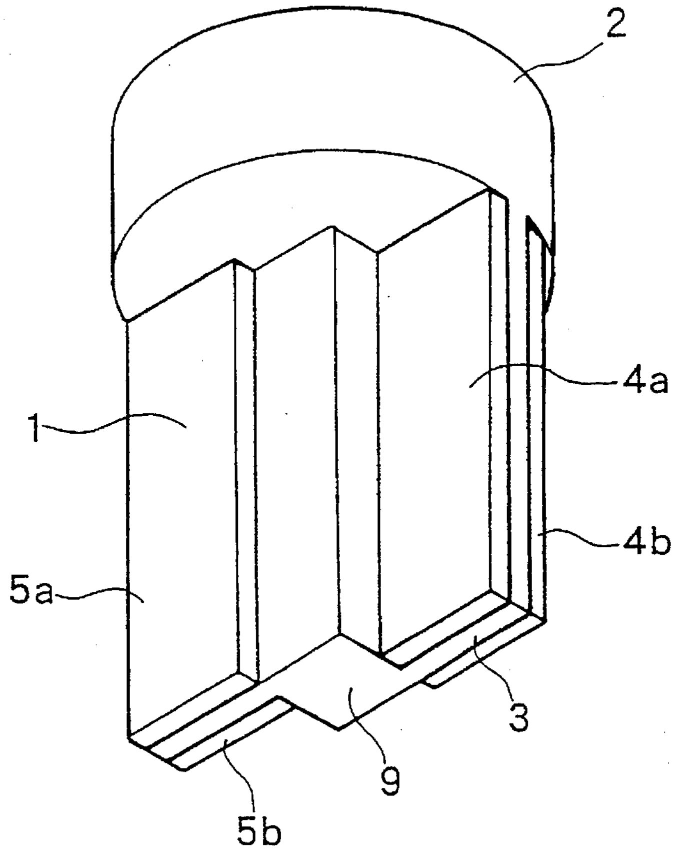
FIG. 5 is a perspective view of a twist vibrator according to a further embodiment of the present invention.

In FIGS. 1, 2, 3 and 5, for forming the cemented piezoelectric bimorph 1, the vibrating plate 3 is formed of a completely integral structure. Then, the rigid block 2 and the vibrating plates 3 are formed of a completely integral structure which is comprised of a cut-produced member, a cast-produced member, or the like. In the example of FIG. 3, the vibrating plate 3 includes two plate portions extending radially in a plane and in symmetrical relation with respect and integral with to a shaft portion or member 9 about which twist vibration is to be produced. In the example of FIG. 5, the vibrating plate 3 includes two plate portions extending in two parallel planes and in symmetrical relation with respect and integral with to the shaft 9.

Figure 4:
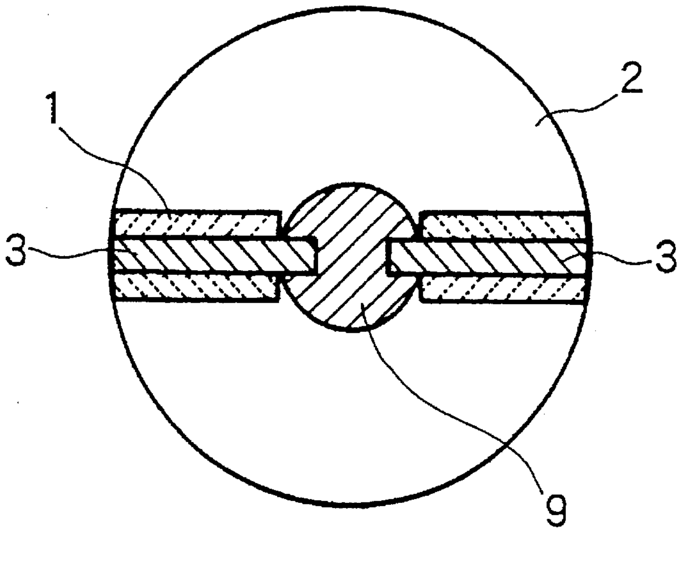
FIG. 4 is a sectional view of a twist vibrator according to yet another embodiment of the present invention.

In the example of FIG. 4, the vibrating plate 3 comprises two plate portions or parts which are integrally connected through the shaft portion 9 and which are allowed to extend in one or two planes. Then, in accordance with the above description, the piezoelectric plates are attached to the vibrating plate 3, thereby constituting the piezoelectric bimorph 1. The rigid block 2 and the vibrating plate 3 are formed of separate parts, respectively, which can be connected by welding, soldering, screwing, or the like.

Figure 6:
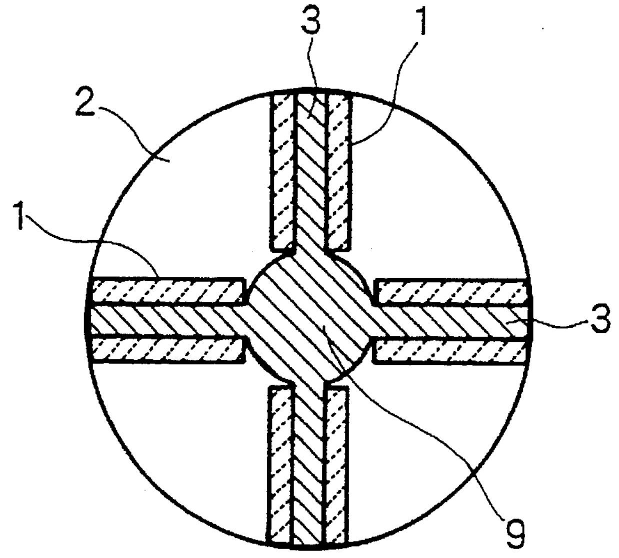
FIG. 6 is a sectional view of a twist vibrator according to a still further embodiment of the present invention.

FIG. 6 shows another example, in which a plurality units of the piezoelectric bimorph 1 are radially arranged and in symmetric relation as a whole.

The rigid block 2 is in symmetric relation with respect to the axis about which twist vibration is produced and is formed of a weight (for example, metal block) having a predetermined gravity. A liquid detector is connected to the shaft portion 9 at one end of the twist vibrator, i.e., one end of the piezoelectric bimorph 1 on the axis about which twist vibration is to be produced, to thereby constitute a viscometer, a density meter, a liquid level indicator, or the like. For resonating the twist vibrator and the liquid detector, the rigid block 2 formed of the weight having a predetermined gravity takes a good balance with the liquid detector and therefore can also be employed as means for producing a proper resonation.

The present invention includes a case wherein the piezoelectric bimorph 1 (which can also be referred to as the vibrating plate 3) is not arranged in symmetrical relation to the axis about which twist vibration is to be produced, according to the inventive concept set forth hereinabove.

In the twist vibrator according to the present invention, owing to a provision of the rigid block, the second end of the piezoelectric bimorph, whose first end vibrates in the twisting direction, is positively restrained from deformation and only the first end of the piezoelectric bimorph produces active twist vibration. Accordingly, the twist vibrator of the present invention can be effectively used as a vibration source employing the first end of the piezoelectric bimorph as an output end.

Also, the rigid block can be used as means for attaching or fixing, either directly or indirectly, to a support member. The use of the rigid block as a fixing means does not affect adversely the twist vibration produced from the output end of the piezoelectric bimorph. Moreover, since a sufficient fixing area can be obtained, a firm fixture is ensured.

Furthermore, while obtaining the same twist vibration as that of the conventional twist vibrator, the amount of material used for the piezoelectric element, such as ceramic material, can be reduced by half. As a result, the cost can be reduced, the size can be made small, and manufacturing becomes easy.

It is to be understood that the forms of the invention disclosed herein are to be taken as the preferred embodiments thereof, and that various changes in the shape, size, and arrangement of parts as well as various procedural changes may be resorted to without departing from the spirit of the invention or the scope of the following claims.

What is claimed is:

1. A twist vibrator comprising:

a rigid block;

a vibrating plate having opposite surfaces extending in a longitudinal direction between opposite ends, one said end being integral and rigid with said rigid block such that said vibrating plate extending from said rigid block with the other said end of said vibrating plate spaced from said rigid block;

each said surface of said vibrating plate having attached thereto at least one piezoelectric plate defining at least two piezoelectric areas that extend between said opposite ends of said vibrating plate, each said piezoelectric area at one said surface of said vibrating plate being arranged in opposite relationship to a corresponding said piezoelectric area at the opposite said surface of said vibrating plate, each said piezoelectric area being capable of elongation and contraction in directions parallel to said longitudinal direction, with elongation and contraction of each said piezoelectric area being opposite to elongation and contraction of an adjacent said piezoelectric area on the same said surface of said vibrating plate and opposite to elongation and contraction of said corresponding said piezoelectric area at said opposite surface of said vibrating plate, thus forming coacting piezoelectric areas capable of imparting twisting vibration to said other end of said vibrating plate about an axis of said vibrator extending in said direction, with said one end of said vibrating plate being restrained from deformation due to integral and rigid fixation thereof with said rigid block; and said vibrating plate comprising a shaft portion integral and rigid with said rigid block, and at least two plate portions extending from said shaft portion in directions symmetrical thereto, with said shaft portion forming a center of said vibrating plate about which is imparted the twisting vibration at said other end thereof.

2. A twist vibrator as claimed in claim 1, wherein each said plate portion has opposite surfaces having attached thereto respective said piezoelectric plates defining respective said piezoelectric areas.

3. A twist vibrator as claimed in claim 1, wherein said plate portions are formed in one piece with said shaft portion.

4. A twist vibrator as claimed in claim 1, wherein said plate portions are members formed separately from said shaft portion and integrally attached thereto.

5. A twist vibrator as claimed in claim 1, wherein said plate portions extend from said shaft portion in opposite radial directions in coplanar alignment.

6. A twist vibrator as claimed in claim 1, wherein said plate portions extend from said shaft portion in opposite directions in respective parallel planes.

7. A twist vibrator as claimed in claim 1, comprising two pairs of said plate portions, each said pair of plate portions extending from said shaft portion in opposite radial directions in coplanar alignment in a respective plane, the planes of said two pairs of plate portions being perpendicular to each other.

8. A twist vibrator as claimed in claim 1, wherein all of said piezoelectric plates are free of direct connection to said rigid block.

* * * * *